(12) United States Patent
Shirai et al.

(10) Patent No.: US 10,804,290 B2
(45) Date of Patent: Oct. 13, 2020

(54) SEMICONDUCTOR DEVICE AND METHOD OF MANUFACTURING THE SAME

(71) Applicant: TOSHIBA MEMORY CORPORATION, Minato-ku (JP)

(72) Inventors: Kaito Shirai, Yokkaichi (JP); Hideto Takekida, Nagoya (JP); Tatsuo Izumi, Yokkaichi (JP); Reiko Shamoto, Nagoya (JP); Takahisa Kanemura, Yokohama (JP); Shigeo Kondo, Yokkaichi (JP)

(73) Assignee: TOSHIBA MEMORY CORPORATION, Minato-ku (JP)

( * ) Notice: Subject to any disclaimer, the term of this patent is extended or adjusted under 35 U.S.C. 154(b) by 0 days.

(21) Appl. No.: 16/351,832

(22) Filed: Mar. 13, 2019

(65) Prior Publication Data

US 2019/0214405 A1 Jul. 11, 2019

Related U.S. Application Data

(63) Continuation of application No. PCT/JP2016/077817, filed on Sep. 21, 2016.

(51) Int. Cl.
 *H01L 27/11582* (2017.01)
 *H01L 29/51* (2006.01)
 (Continued)

(52) U.S. Cl.
 CPC .... *H01L 27/11582* (2013.01); *H01L 27/1157* (2013.01); *H01L 27/11565* (2013.01); *H01L 29/40117* (2019.08); *H01L 29/517* (2013.01)

(58) Field of Classification Search
 CPC ......... H01L 27/11582; H01L 27/11565; H01L 27/1157; H01L 29/40117; H01L 29/517
 See application file for complete search history.

(56) References Cited

U.S. PATENT DOCUMENTS

| 7,576,011 B2 | 8/2009 | Hyun |
| 7,847,342 B2 | 12/2010 | Fukuzumi et al. |

(Continued)

FOREIGN PATENT DOCUMENTS

| JP | 3997494 | 10/2007 |
| JP | 2009-135324 | 6/2009 |

(Continued)

OTHER PUBLICATIONS

International Search Report dated Nov. 22, 2016 in PCT/JP2016/077817 (with English translation of categories of cited documents), 3 pages.

*Primary Examiner* — Nathan W Ha
(74) *Attorney, Agent, or Firm* — Oblon, McClelland, Maier & Neustadt, L.L.P.

(57) ABSTRACT

According to one embodiment, the stacked body includes a first stacked portion including a plurality of electrode layers, a second stacked portion including a plurality of electrode layers, and being disposed separately from the first stacked portion in the first direction, and a connection portion including a high dielectric layer provided between the first stacked portion and the second stacked portion and having a dielectric constant higher than a dielectric constant of the insulator. The column-shaped portion includes a first portion provided in the first stacked portion and extending in the first direction of the stacked body, a second portion provided in the second stacked portion and extending in the first direction, and an intermediate portion provided in the connection portion and connected the first portion to the second portion.

19 Claims, 15 Drawing Sheets

(51) Int. Cl.
*H01L 27/11565* (2017.01)
*H01L 21/28* (2006.01)
*H01L 27/1157* (2017.01)

(56) References Cited

U.S. PATENT DOCUMENTS

| | | | |
|---|---|---|---|
| 8,187,936 B2 | 5/2012 | Alsmeier et al. | |
| 8,247,863 B2 | 8/2012 | Fukuzumi et al. | |
| 8,415,242 B2 | 4/2013 | Mizushima et al. | |
| 8,426,301 B2 * | 4/2013 | Oh | H01L 27/0688 257/E21.662 |
| 8,759,983 B2 | 6/2014 | Wada et al. | |
| 8,946,808 B2 | 2/2015 | Lee et al. | |
| 9,397,109 B1 | 7/2016 | Fukuzumi | |
| 9,673,217 B1 * | 6/2017 | Sakata | H01L 27/11582 |
| 2009/0090965 A1 | 4/2009 | Kito et al. | |
| 2010/0109065 A1 | 5/2010 | Oh et al. | |
| 2010/0109072 A1 | 5/2010 | Kidoh et al. | |
| 2010/0207195 A1 | 8/2010 | Fukuzumi et al. | |
| 2011/0065270 A1 | 3/2011 | Shim et al. | |
| 2011/0287612 A1 | 11/2011 | Lee et al. | |
| 2012/0043599 A1 | 2/2012 | Katsumata et al. | |
| 2013/0069139 A1 | 3/2013 | Ishihara et al. | |
| 2013/0126961 A1 | 5/2013 | Fukuzumi et al. | |
| 2013/0252391 A1 | 9/2013 | Lee et al. | |
| 2013/0313629 A1 | 11/2013 | Shim et al. | |
| 2014/0084364 A1 | 3/2014 | Taniguchi | |
| 2014/0217493 A1 | 8/2014 | Fukuzumi et al. | |
| 2015/0060993 A1 | 3/2015 | Lee et al. | |
| 2015/0069489 A1 | 3/2015 | Higuchi et al. | |
| 2015/0155296 A1 * | 6/2015 | Yoon | H01L 27/11582 257/324 |
| 2015/0200203 A1 * | 7/2015 | Jang | H01L 27/1157 257/324 |
| 2015/0200204 A1 | 7/2015 | Fukuzumi et al. | |
| 2015/0263036 A1 | 9/2015 | Yasuda et al. | |
| 2016/0005760 A1 * | 1/2016 | Lee | H01L 27/1157 257/324 |
| 2016/0079272 A1 * | 3/2016 | Lee | H01L 27/11582 438/269 |
| 2016/0240554 A1 | 8/2016 | Fukuzumi et al. | |
| 2017/0236835 A1 | 8/2017 | Nakamura et al. | |
| 2017/0263614 A1 * | 9/2017 | Tokuhira | H01L 29/40117 |
| 2017/0358593 A1 * | 12/2017 | Yu | H01L 23/5226 |

FOREIGN PATENT DOCUMENTS

| | | |
|---|---|---|
| JP | 2009-146954 A | 7/2009 |
| JP | 2009-182181 | 8/2009 |
| JP | 2010-114204 A | 5/2010 |
| JP | 2010-199314 | 9/2010 |
| JP | 2011-66417 A | 3/2011 |
| JP | 2011-199177 | 10/2011 |
| JP | 2011-249803 A | 12/2011 |
| JP | 5176177 | 4/2013 |
| JP | 2013-165266 | 8/2013 |
| JP | 2013-534058 | 8/2013 |
| JP | 2015-56444 A | 3/2015 |
| JP | 2015-177013 | 10/2015 |

\* cited by examiner

SEMICONDUCTOR DEVICE AND METHOD OF MANUFACTURING THE SAME

CROSS-REFERENCE TO RELATED APPLICATION

This is a continuation application of International Application PCT/JP2016/077817, filed on Sep. 21, 2016; the entire contents of which are incorporated herein by reference. This application also claims priority to International Application PCT/JP2016/077817, filed on Sep. 21, 2016. The entire contents of each are incorporated herein by reference.

FIELD

Embodiments of the invention relates to a semiconductor device and a method of manufacturing the same.

BACKGROUND

A semiconductor storage device having a three dimensional structure in which memory cells are three-dimensionally disposed has been proposed. In manufacturing such a semiconductor storage device, holes are formed in a stacked body including multiple conductive layers. As the number of stacked layers in the stacked body increases, it becomes difficult to collectively form the holes. A method has been proposed in which holes can be easily formed even in a stacked body having a large number of stacked layers by repeating formation of the holes and formation of the stacked body (stacked portion). There has been a possibility that the cell current is decreased in the semiconductor storage device manufactured by this method.

DETAILED DESCRIPTION

Figure 1:
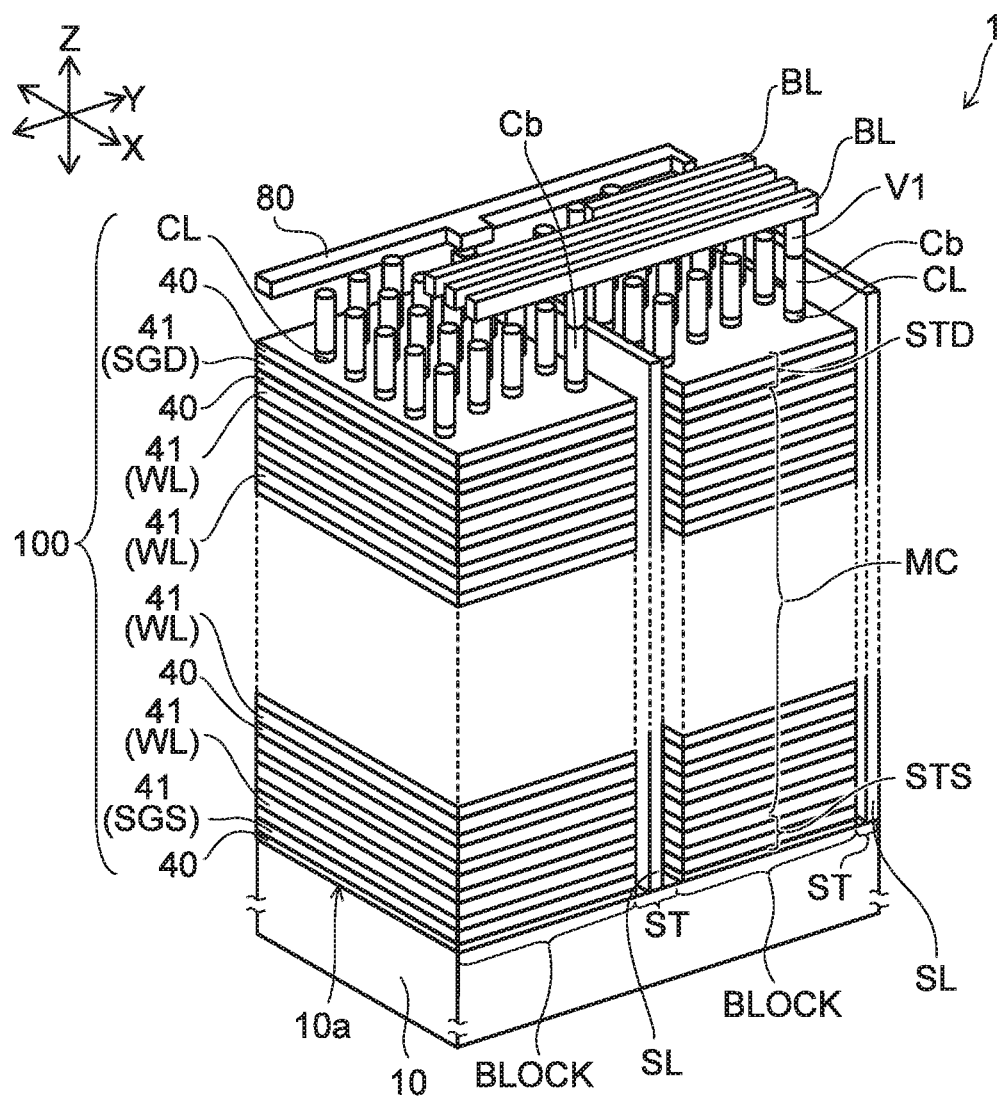
FIG. 1 is a schematic perspective view of a semiconductor device according to a first embodiment.

Embodiments provide a semiconductor device capable of preventing a decrease in cell current.

According to an embodiment, the semiconductor device includes a stacked body and a column-shaped portion. The stacked body includes a first stacked portion including a plurality of electrode layers stacked in a first direction via an insulator, a second stacked portion including a plurality of electrode layers stacked in the first direction via an insulator and being disposed separately from the first stacked portion in the first direction, and a connection portion including a high dielectric layer provided between the first stacked portion and the second stacked portion and having a dielectric constant higher than a dielectric constant of the insulator. The column-shaped portion includes a first portion provided in the first stacked portion and extending in the first direction of the stacked body, a second portion provided in the second stacked portion and extending in the first direction, and an intermediate portion provided in the connection portion and connected the first portion to the second portion. The connection portion includes an insulating layer between the high dielectric layer and the second stacked portion. And a maximum diameter of a portion, which is surrounded by the high dielectric layer, of the intermediate portion is smaller than a diameter of a lower end of the first portion when viewed from the first direction.

Hereinafter, embodiments will be described with reference to the drawings. In the drawings, the same components are denoted by the same reference numerals. The semiconductor device of the embodiment is a semiconductor storage device having a memory cell array.

First Embodiment: Semiconductor Device

FIG. 1 is a schematic perspective view of a memory cell array 1 of a semiconductor device according to a first embodiment. In FIG. 1, two directions parallel to a major surface 10a of a substrate 10 and perpendicular to each other are defined as an X-direction (first direction) and a Y-direction (second direction), and a direction perpendicular to both the X-direction and the Y-direction is defined as a Z-direction (stacking direction of a stacked body 100).

<Memory Cell Array 1>

As shown in FIG. 1, the semiconductor device of the first embodiment includes the memory cell array 1. The memory cell array 1 is provided, for example, on the major surface 10a of the substrate 10. The substrate 10 is, for example, a semiconductor substrate. The semiconductor substrate contains, for example, silicon. The conductivity type of the substrate 10 is, for example, a p-type.

The memory cell array 1 includes a stacked body 100, a source line SL, an upper-layer interconnection 80, multiple column-shaped portions CL, and multiple bit lines BL. The stacked body 100 is provided on the major surface 10a of the substrate 10. The stacked body 100 includes multiple electrode layers 41 and multiple insulators 40.

The electrode layers 41 are stacked via the insulators 40. The electrode layer 41 includes a conductive material. The conductive material includes, for example, tungsten. The insulator 40 may be an insulating material such as a silicon oxide film or may include an air gap. Any number of electrode layers 41 may be stacked.

The multiple electrode layers 41 includes at least one source-side selection gate SGS, multiple word lines WL, and at least one drain-side selection gate SGD.

The source-side selection gate SGS is a gate electrode of a source-side select transistor STS. The source-side select transistor STS is provided, for example, in the lowermost layer of the stacked body 100. The drain-side selection gate SGD is a gate electrode of a drain-side select transistor STD. The drain-side select transistor STD is provided, for example, in the uppermost layer of the stacked body 100. Multiple memory cells MC are connected in series between the drain-side select transistor STD and the source-side select transistor STS. The word line WL is a gate electrode of the memory cell MC. Any number of electrode layers 41 may be stacked.

The source line SL is provided in the stacked body 100. The source line SL extends in the Z-direction and the X-direction. The source line SL divides the stacked body 100 into multiple regions in the Y-direction. Each region divided by the source line SL is called a "block".

The source line SL includes a conductive material. The conductive material includes, for example, at least one of tungsten and titanium. The source line SL is electrically connected to the substrate 10.

The upper-layer interconnection 80 is provided on the source line SL. The upper-layer interconnection 80 extends in the Y-direction. The upper-layer interconnection 80 is electrically connected to the multiple source lines SL aligned in the Y-direction. The upper-layer interconnection 80 is electrically connected to a peripheral circuit (not shown).

The column-shaped portion CL is provided in the stacked body 100 divided by the source line SL. The column-shaped portion CL extends in the Z-direction. The column-shaped portion CL is formed in, for example, a column shape or an elliptical column shape. The column-shaped portion CL is disposed in a block, for example, in a staggered pattern or a square lattice pattern. The drain-side select transistor STD, the source-side select transistor STS, and the memory cell MC are disposed in the column-shaped portion CL.

The bit line BL is provided on the column-shaped portion CL. The bit line BL extends in the Y-direction. The upper end of the column-shaped portion CL is electrically connected to one of the bit lines BL via a first contact portion Cb and a second contact portion V1. Each bit line BL is electrically connected to the column-shaped portion CL selected one by one from each block. The lower end of the column-shaped portion CL is electrically connected to the source line SL via the substrate 10.

<Stacked Body 100>

Figure 2:
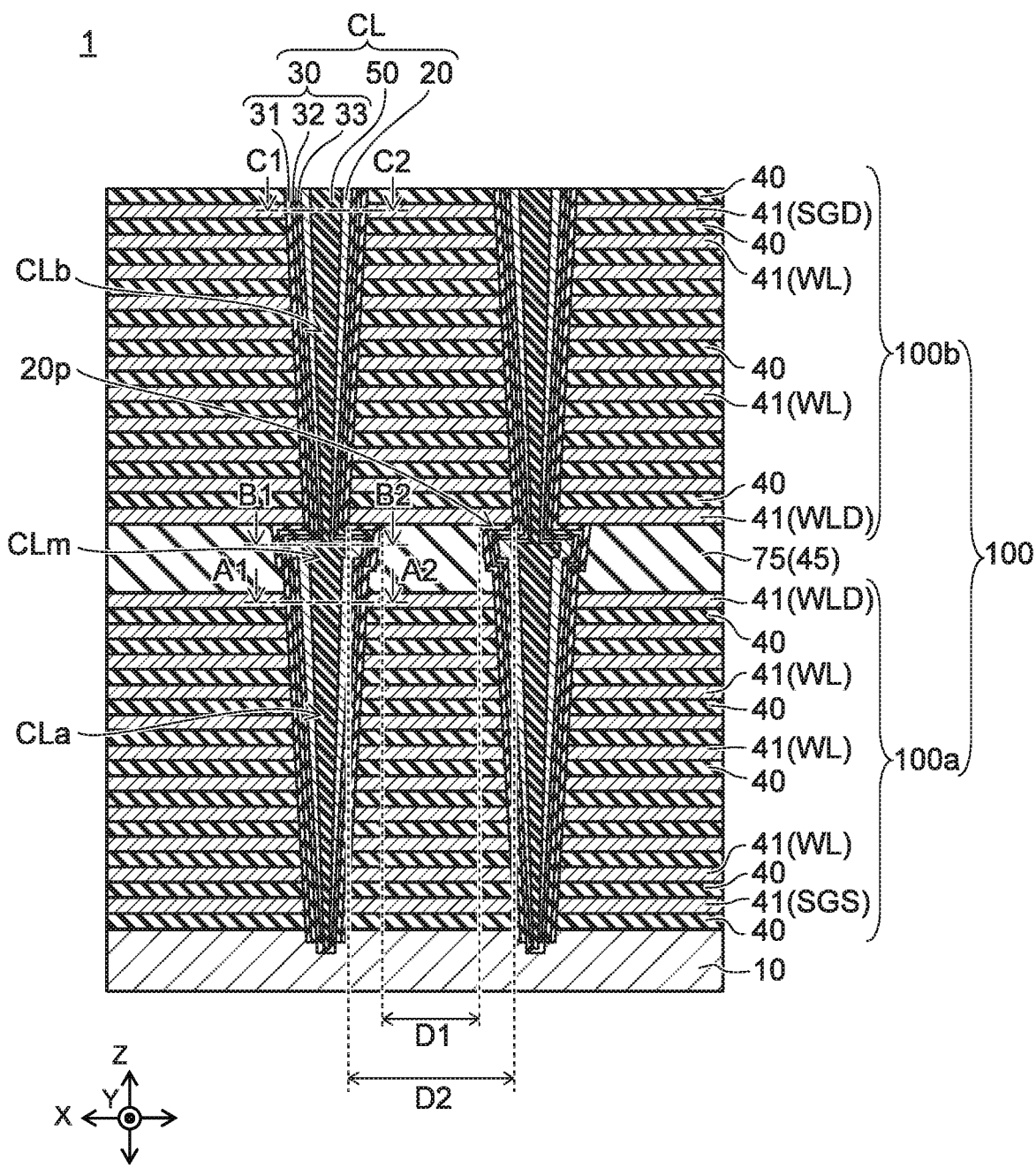
FIG. 2 is a schematic cross-sectional view of the semiconductor device of the first embodiment.

FIG. 2 is a schematic cross-sectional view of the semiconductor device of the first embodiment.

Figure 3A:
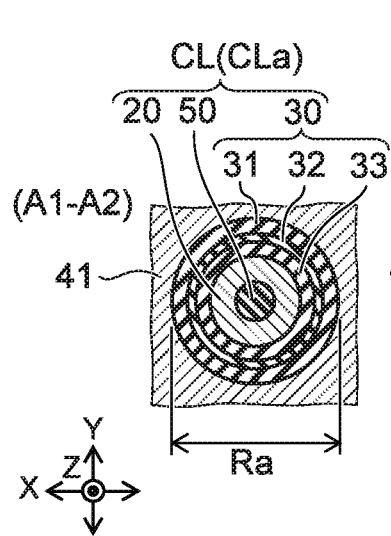
FIGS. 3A to 3C are schematic cross-sectional views showing the column-shaped portion of the semiconductor device of the first embodiment.
Figure 3B:
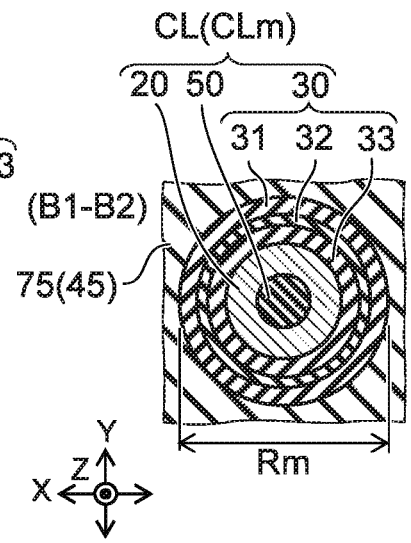
Figure 3C:
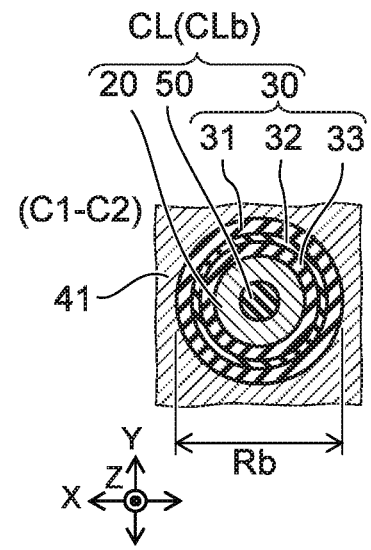

FIGS. 3A to 3C are schematic cross-sectional views showing the column-shaped portion of the semiconductor device of the first embodiment.

FIG. 3A is a schematic cross-sectional view showing a cross section taken along line A1-A2 shown in FIG. 2. FIG. 3B is a schematic cross-sectional view showing a cross section taken along line B1-B2 shown in FIG. 2. FIG. 3C is a schematic cross-sectional view showing a cross section taken along line C1-C2 shown in FIG. 2.

As shown in FIG. 2, the stacked body 100 includes a first stacked portion 100a, a connection portion 45, and a second stacked portion 100b. The first stacked portion 100a is provided on the substrate 10. The connection portion 45 is provided on the first stacked portion 100a. The second stacked portion 100b is provided on the connection portion 45. Each of the stacked portions 100a and 100b may have any number of stacked layers. The thickness of the connection portion 45 in the Z-direction is, for example, greater than the thickness of one layer of the insulator 40.

The connection portion 45 includes a high dielectric layer 75. As the high dielectric layer 75, a material with a high specific dielectric constant is used. For example, the high dielectric layer 75 includes one or more selected from the group consisting of a silicon carbonitride, a hafnium oxide, a zirconium oxide, and an aluminum oxide. As the high dielectric layer 75, for example, a carbon-containing silicon nitride layer, a hafnium silicate layer, an aluminum silicate layer, a zirconium silicate layer, or the like may be used. The specific dielectric constant of the high dielectric layer 75 is higher than the specific dielectric constant of the insulator 40. In the first embodiment, the high dielectric layer 75 is provided in the entire connection portion 45.

The first stacked portion 100a and the second stacked portion 100b may include the electrode layer 41 functioning as a dummy word line WLD. For example, in the first stacked portion 100a, the electrode layer 41 closest to the connection portion 45 functions as a dummy word line WLD. For example, in the second stacked portion 100b, the electrode layer 41 closest to the connection portion 45 functions as a dummy word line WLD.

<Column-Shaped Portion CL>

The column-shaped portion CL includes a first portion CLa, an intermediate portion CLm, and a second portion CLb. The first portion is provided in the first stacked portion 100a. The intermediate portion CLm is provided in the connection portion 45. The second portion CLb is provided in the second stacked portion 100b.

The intermediate portion CLm connects the first portion CLa and the second portion CLb. As shown in FIGS. 3A to 3C, when viewed from the Z-direction, a maximum diameter Rm of the intermediate portion CLm is larger than a diameter Ra of the upper end of the first portion CLa. When viewed from the Z-direction, the maximum diameter Rm of the intermediate portion CLm is larger than a diameter Rb of the lower end of the second portion CLb. In the adjacent two column-shaped portions CL, a shortest distance D1 between the respective intermediate portions CLm is shorter than a distance D2 between the lower ends of the respective second portions CLb.

The column-shaped portion CL includes a memory film 30, a semiconductor body 20, and a core layer 50. The memory film 30, the semiconductor body 20, and the core layer 50 extend in the Z-direction.

The shape of the memory film 30 is, for example, cylindrical. The semiconductor body 20 is provided on the memory film 30. The core layer 50 is surrounded by the semiconductor body 20.

The memory film 30 includes a block insulating film 31, a charge storage portion 32, and a tunnel insulating film 33. The block insulating film 31 is provided between the semiconductor body 20 and the stacked body 100. The charge storage portion 32 is provided between the semiconductor body 20 and the block insulating film 31. The tunnel insulating film 33 is provided between the semiconductor body 20 and the charge storage portion 32.

The block insulating film 31 includes, for example, a silicon oxide. The block insulating film 31 prevents back tunneling of charges from the electrode layer 41 to the charge storage portion 32, for example, during the erasing operation.

The charge storage portion 32 includes, for example, a silicon nitride. The charge storage portion 32 may contain a hafnium oxide in addition to the silicon nitride. The charge storage portion 32 contains in the film a trap site that traps the charges. The charges are trapped in the trap site. The threshold voltage of the memory cell MC varies depending on the presence or absence or the amount of the charges trapped in the charge storage portion 32. Accordingly, the memory cell MC retains information.

The tunnel insulating film 33 includes, for example, a silicon oxide. The tunnel insulating film 33 is a potential barrier between the charge storage portion 32 and the semiconductor body 20. In the tunnel insulating film 33, charge tunneling occurs when injecting the charges from the semiconductor body 20 to the charge storage portion 32 (writing operation) and when ejecting the charge from the charge storage portion 32 to the semiconductor body 20 (erasing operation).

The semiconductor body 20 is electrically connected to the substrate 10. The semiconductor body 20 includes, for example, silicon. Silicon is, for example, polysilicon obtained by crystallizing amorphous silicon. The core layer 50 is provided on the semiconductor body 20. The core layer 50 includes, for example, a silicon oxide.

The column-shaped portion CL is provided in a hole formed in the stacked body 100. As the number of stacked layers in the stacked body 100 increases, it becomes difficult to form the holes. As one of the methods for facilitating the formation of holes, there is a method of forming the stacked body (stacked portion 100a, stacked portion 100b, or the like) and the holes several times. Each hole formed in each of the stacked portions 100a and 100b communicates with each other in the connection portion 45.

In the connection portion 45, the diameter of the hole to be formed is enlarged. Accordingly, the connection of each hole is facilitated. The thickness of the connection portion 45 is thicker than the thickness of the insulator 40 in order to allocate the processing margin of the hole formed on the connection portion 45. By providing the connection portion 45 with a sufficiently large thickness, for example, the hole in the upper portion is prevented from penetrating the lower layer (such as the electrode layer 41) of the connection portion 45.

However, the strength of the fringe electric field applied from the electrode layer 41 to the semiconductor body 20 depends on the film thicknesses of the insulator 40 and the connection portion 45.

A case is considered where the connection portion 45 is made of the same material (for example, a silicon oxide) as the insulator 40. In this case, the strength of the fringe electric field applied to the semiconductor body 20 in the connection portion 45 is weaker than the strength of the fringe electric field applied to the semiconductor body 20 surrounded by the insulator 40. As a result, there is a circumstance that the resistance of the semiconductor body 20 in the connection portion 45 is higher than the resistance of the semiconductor body 20 of each of the stacked portions 100a and 100b, and thus, this situation may cause a decrease in cell current. In addition, the semiconductor body 20 in the connection portion 45 has a corner portion 20p. The fringe electric field applied from the electrode layer 41 is more easily concentrated in the corner portion 20p than in the periphery of the corner portion 20p. For this reason, in the semiconductor body 20 in the connection portion 45, a channel (inversion layer) is hardly induced as compared with the semiconductor body 20 in each of the stacked portions 100a and 100b. Accordingly, there is a circumstance that it is necessary to apply a high voltage to the electrode layer 41 when inducing the channel in the periphery of the corner portion 20p.

On the other hand, in the first embodiment, the high dielectric layer 75 is used as the connection portion 45. For this reason, the strength of the fringe electric field applied to the semiconductor body 20 in the connection portion 45 can be increased. Accordingly, the resistance of the semiconductor body 20 in the connection portion 45 is low as compared with the case where the same material as the insulator 40 is used as the connection portion 45. As a result, it is possible to prevent a decrease in cell current.

The periphery of the corner portion 20p is surrounded by the high dielectric layer 75. For this reason, as compared with the case where the periphery of the corner portion 20p is not surrounded by the high dielectric layer 75, it is possible to easily induce a channel in the corner portion 20p. Accordingly, it is unnecessary to apply a high voltage to the electrode layer 41, and it is possible to easily induce a channel in the semiconductor body 20.

First Embodiment: Manufacturing Method

An example of a method of manufacturing the semiconductor device of the first embodiment will be described.

Figure 4:
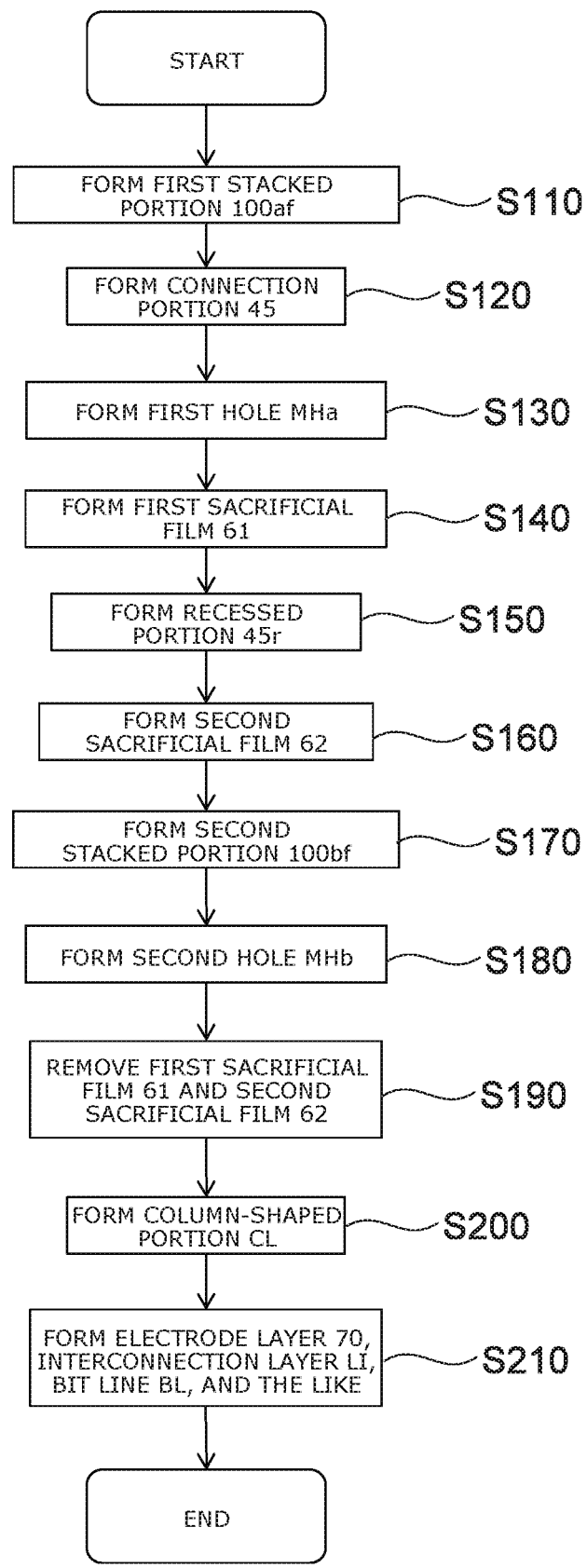
FIG. 4 is a flowchart showing the example of the method of manufacturing the semiconductor device of the first embodiment.

FIG. 4 is a flowchart showing the example of the method of manufacturing the semiconductor device of the first embodiment.

FIG. 5A to FIG. 8B are schematic cross-sectional views showing the method of manufacturing the semiconductor device of the first embodiment.

<Formation of First Stacked Portion 100af>

Figure 5A:
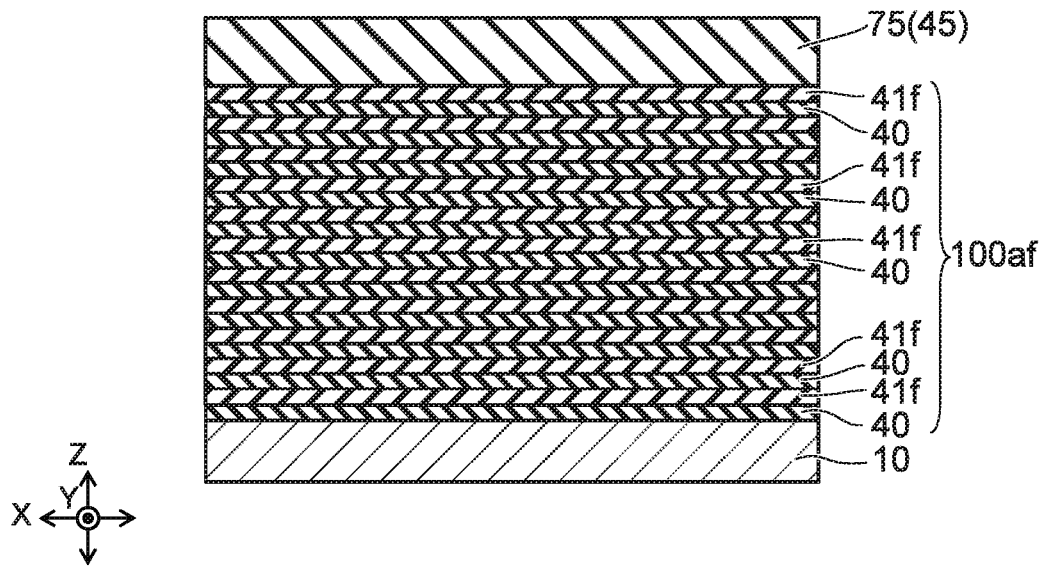
FIG. 5A to FIG. 8B are schematic cross-sectional views showing the method of manufacturing the semiconductor device of the first embodiment.

As shown in FIG. 5A, a first stacked portion 100af is formed on the substrate 10 (step S110). The first stacked portion 100af is formed by alternately stacking replacement members 41f and the insulators 40. For example, the replacement members 41f and the insulators 40 are alternately stacked in the Z-direction. The replacement member 41f is a member which is to be later replaced with the electrode layer 41. The material of the replacement member 41f is selected from the material of which etching selection ratio with the insulator 40 can be obtained. For example, when a silicon oxide is selected as the insulator 40, a silicon nitride is selected for the replacement member 41f.

<Formation of Connection Portion 45>

A connection portion 45 is formed on the first stacked portion 100af (step S120). In the first embodiment, a high dielectric layer 75 is formed as the connection portion 45. As the high dielectric layer 75, a high dielectric material having a specific dielectric constant higher than that of the insulator 40 is selected. For example, the high dielectric layer 75 is formed by using a material including at least one selected from the group consisting of a silicon carbonitride, a hafnium oxide, a zirconium oxide, and an aluminum oxide. For example, the thickness of the high dielectric layer 75 in the Z-direction is formed to be thicker than the thickness of the insulator 40 in the Z-direction.

<Formation of First Hole MHa>

Figure 5B:
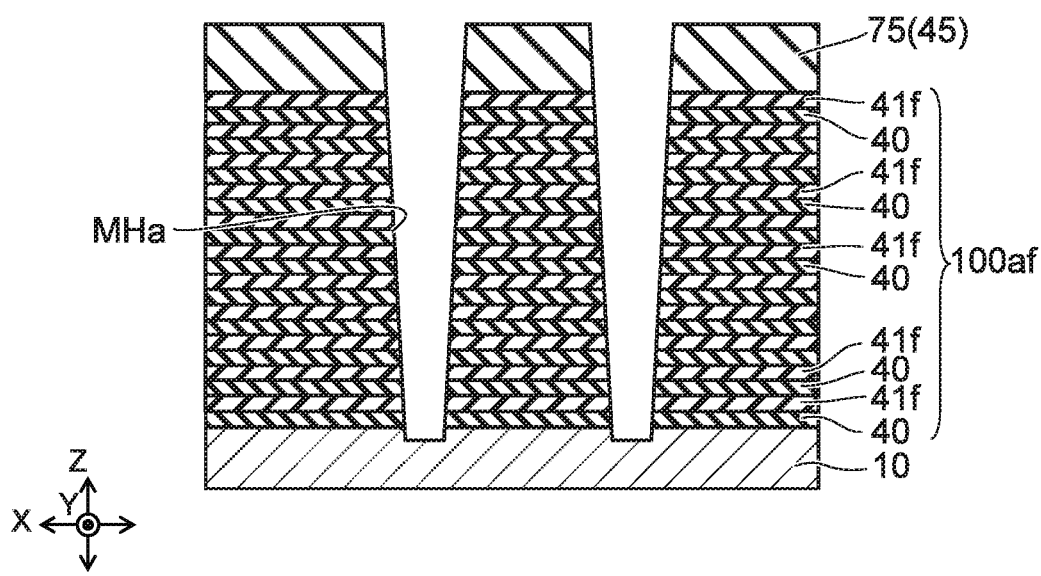

As shown in FIG. 5B, a first hole MHa is formed (step S130). The first hole MHa extends in the connection portion 45 and the first stacked portion 100a in the Z-direction. The first hole MHa penetrates the connection portion 45 and the first stacked portion 100af and reaches the substrate 10. The first hole MHa is formed, for example, by anisotropic etching such as reactive ion etching (RIE).

<Formation of First Sacrificial Film 61>

Figure 6A:
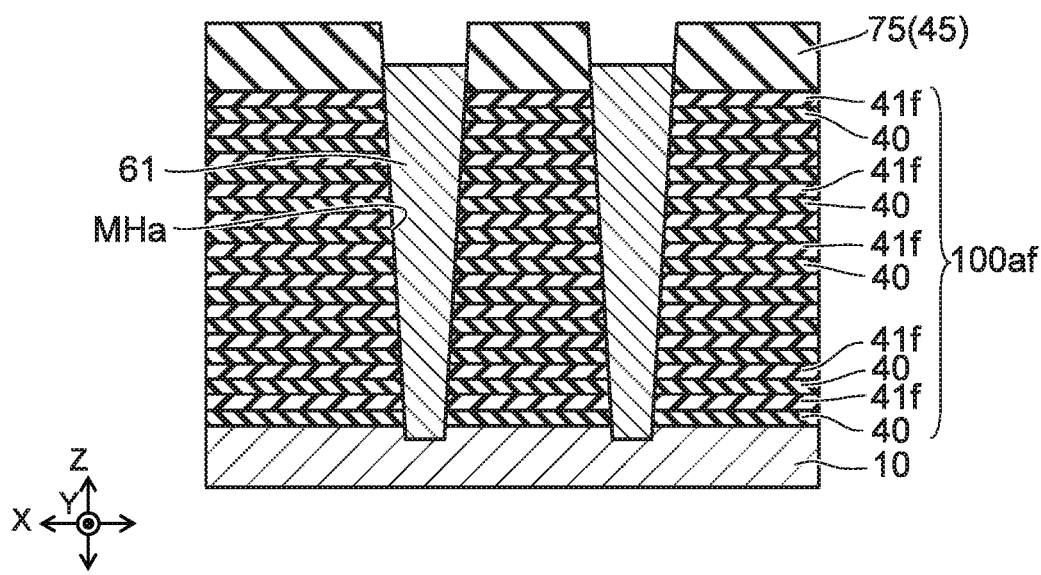

As shown in FIG. 6A, a first sacrificial film 61 is formed in the first hole MHa (step S140). The first sacrificial film 61 is formed from the upper surface of the substrate 10 to the intermediate of the connection portion 45. For example, amorphous silicon is selected as the first sacrificial film 61.

<Formation of Recessed Portion 45r>

Figure 6B:
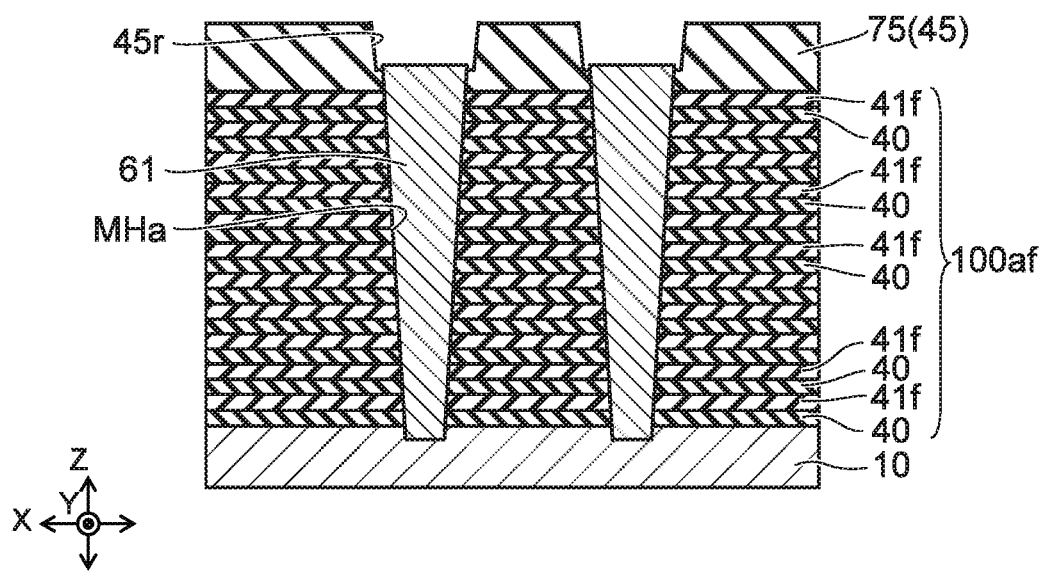

As shown in FIG. 6B, a side surface of the connection portion 45 exposed to the first hole MHa is recessed. Accordingly, a recessed portion 45r is formed in the connection portion 45 (step S150). The recessed portion 45r is formed, for example, by isotopically etching the side surface of the connection portion 45 exposed to the first hole MHa.

<Formation of Second Sacrificial Film 62>

Figure 7A:
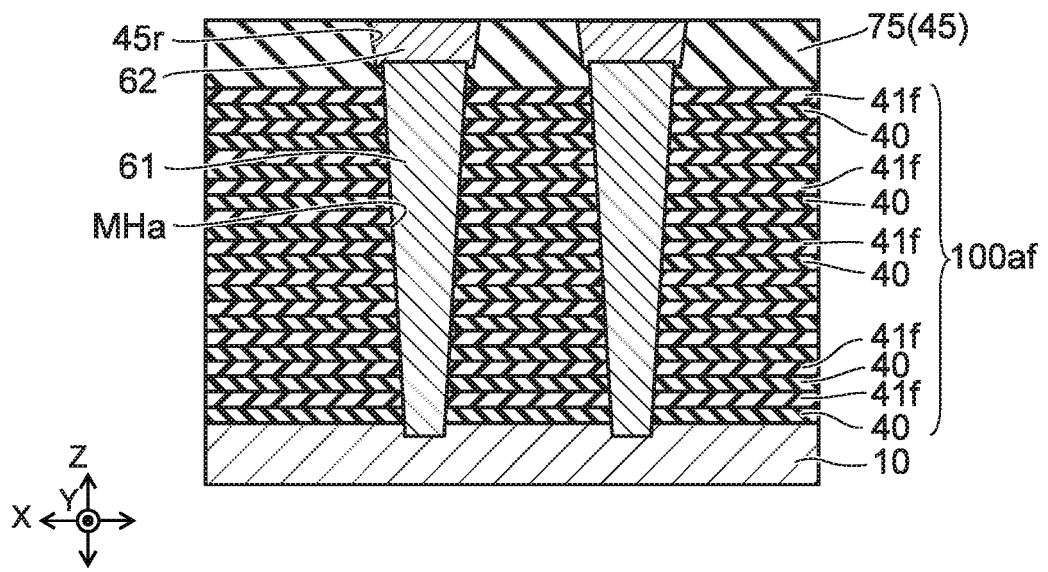

As shown in FIG. 7A, a second sacrificial film 62 is formed in the recessed portion 45r (step S160). By the second sacrificial film 62, the recessed portion 45r is buried. The upper surface of the second sacrificial film 62 is the same plane as the upper surface of the connection portion 45. For example, amorphous silicon is selected as the second sacrificial film 62.

<Formation of Second Stacked Portion 100bf>

Figure 7B:
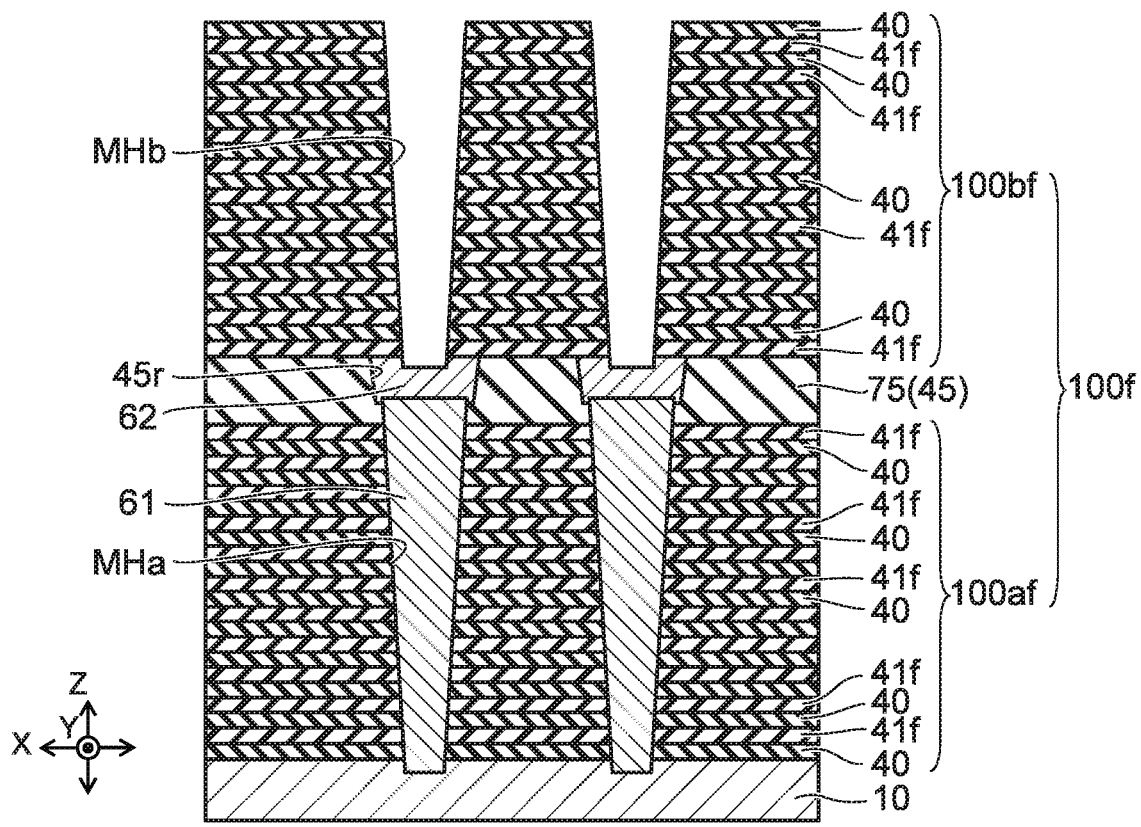

As shown in FIG. 7B, a second stacked portion 100bf is formed on the connection portion 45 and on the sacrificial film 61 (step S170). In the second stacked portion 100bf, the replacement members 41f and the insulators 40 are alternately stacked, similarly to the first stacked portion 100af. Accordingly, a stacked body 100f including the first stacked portion 100af, the connection portion 45, and the second stacked portion 100bf is formed.

<Formation of Second Hole MHb>

A second hole MHb is formed in the second stacked portion 100b (step S180). The second hole MHb penetrates the second stacked portion 100b and reaches the second sacrificial film 62. At this time, when viewed from the Z-direction, the maximum diameter of the second sacrificial film 62 is larger than the diameter of the lower end of the second hole MHb. Accordingly, the allowable range for the positional shift of the second hole MHb can be expanded. The second hole MHb is formed by, for example, anisotropic etching such as reactive ion etching (RIE).

<Removal of First Sacrificial Film 61 and Second Sacrificial Film 62>

Figure 8A:
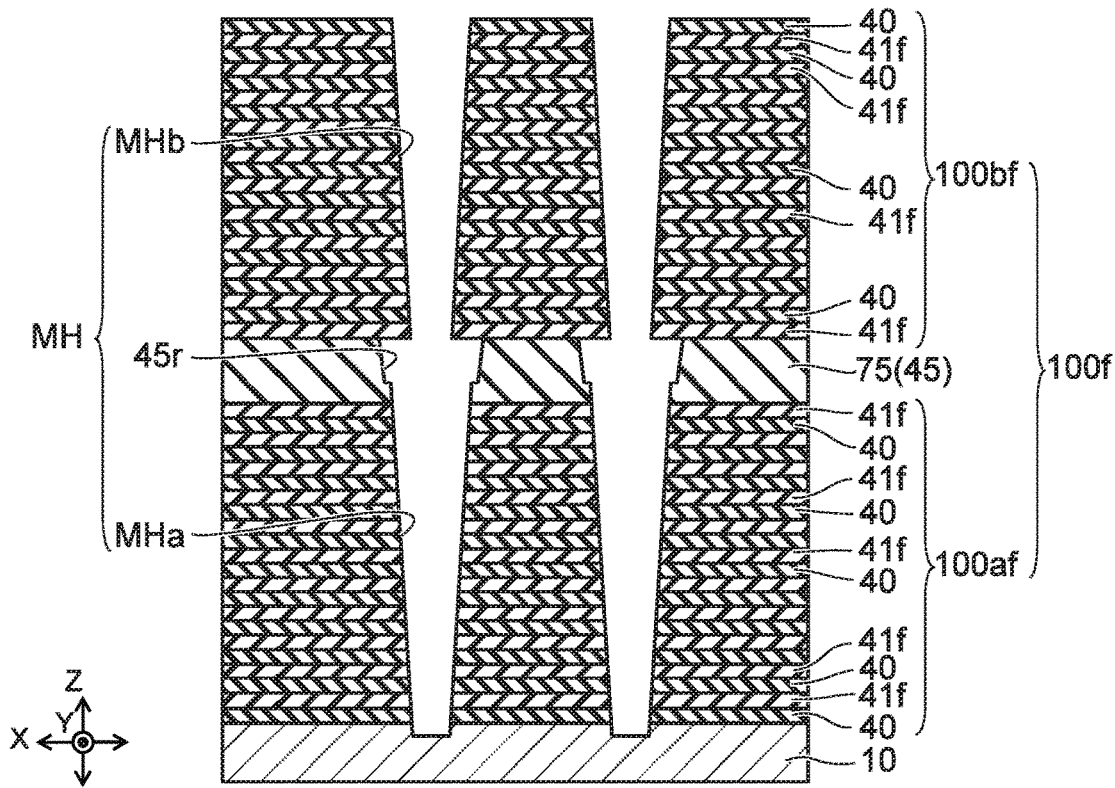

As shown in FIG. 8A, the first sacrificial film 61 and the second sacrificial film 62 are removed via the second hole MHb (step S190). Accordingly, the second hole MHb is connected to the first hole MHa via the recessed portion 45r. Accordingly, the first hole MHa, the recessed portion 45r, and the second hole MHb become holes MH.

<Formation of Column-Shaped Portion CL>

Figure 8B:
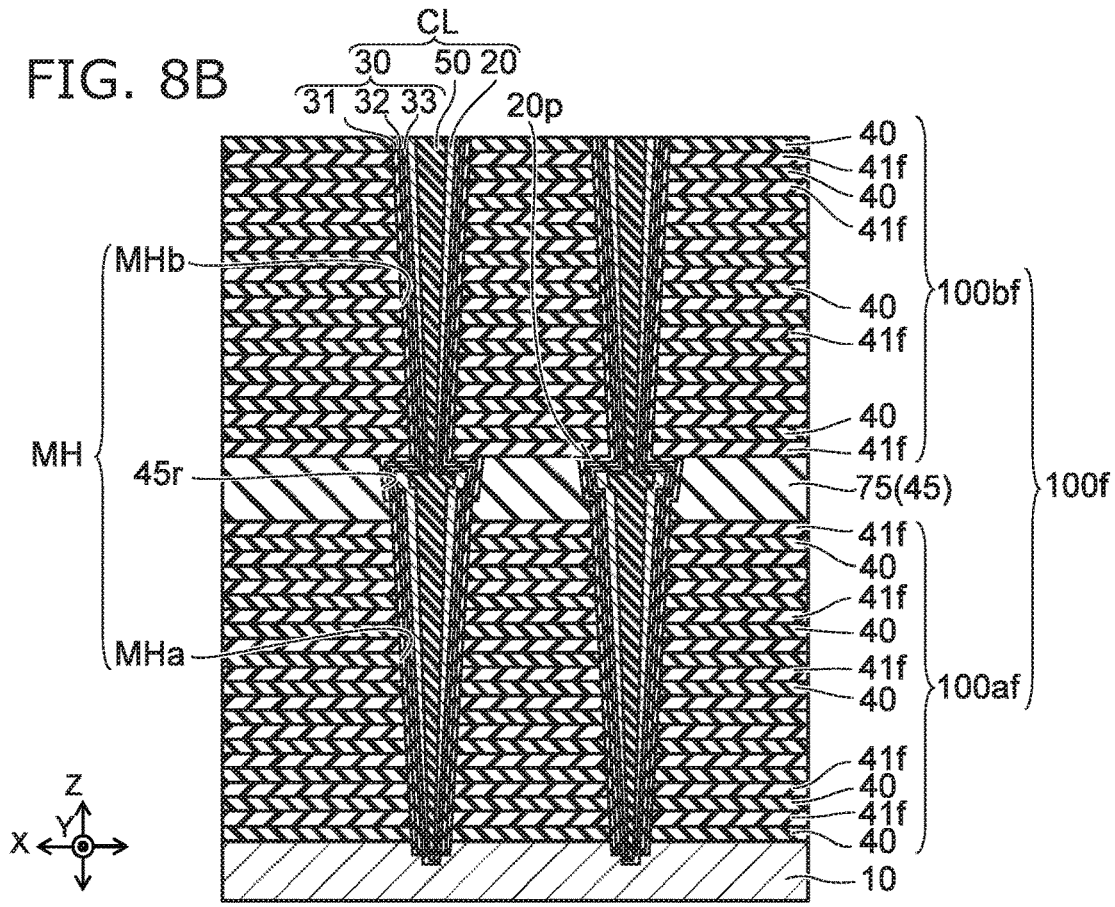

As shown in FIG. 8B, the column-shaped portion CL shown in FIG. 3 is formed in the hole MH (step S200). The column-shaped portion CL is formed through the process of forming the memory film 30, the process of forming the semiconductor body 20, and the process of forming the core layer 50. The semiconductor body 20 is in contact with the substrate 10.

<Formation of Electrode Layer 70, Interconnection Layer LI, Bit Line BL, and the Like>

As shown in FIG. 1 and FIG. 2, the replacement member 41f in the stacked body 100 is removed. The electrode layer 41 is formed in the space from which the replacement member 41f has been removed (step S210). For example, a slit ST is formed to divide the stacked body 100. The slit ST spreads in, for example, the X-direction and the Z-direction. By supplying an etchant to the slit ST, the replacement member 41f is removed. The electrode layer 41 is provided in the space from which the replacement member 41f has been removed via the slit ST. Accordingly, the first stacked portion 100af becomes the first stacked portion 100a. The second stacked portion 100bf becomes the second stacked portion 100b. The stacked body 100f becomes the stacked body 100.

As shown in FIG. 1, an insulating film (not shown) is formed on the side wall of the slit ST. The source line SL is formed in the slit ST. The source line SL is electrically connected to the semiconductor body 20 via the substrate 10.

The upper-layer interconnection 80, the bit line BL, and the like are formed on the stacked body 100, and thus, the semiconductor device of the first embodiment is formed.

In addition, the manufacturing method described above may also be performed in a case where a metal member (for example, tungsten) is selected instead of the replacement member 41f. Accordingly, it is possible to reduce the process of removing the replacement member 41f and the process of forming the electrode layer 41. In addition, also in the embodiment to be described later, a metal member may be selected instead of the replacement member 41f.

By performing the formation of the stacked body (stacked portion) and the formation of the hole in two divided steps, the hole formation becomes easy. In addition, the high dielectric layer 75 is formed as the connection portion 45. Accordingly, it is also possible to prevent a decrease in cell current. The high dielectric layer 75 is formed around the corner portion 20p. Accordingly, it is possible to easily induce a channel in the semiconductor body 20.

Second Embodiment: Semiconductor Device

Figure 9:
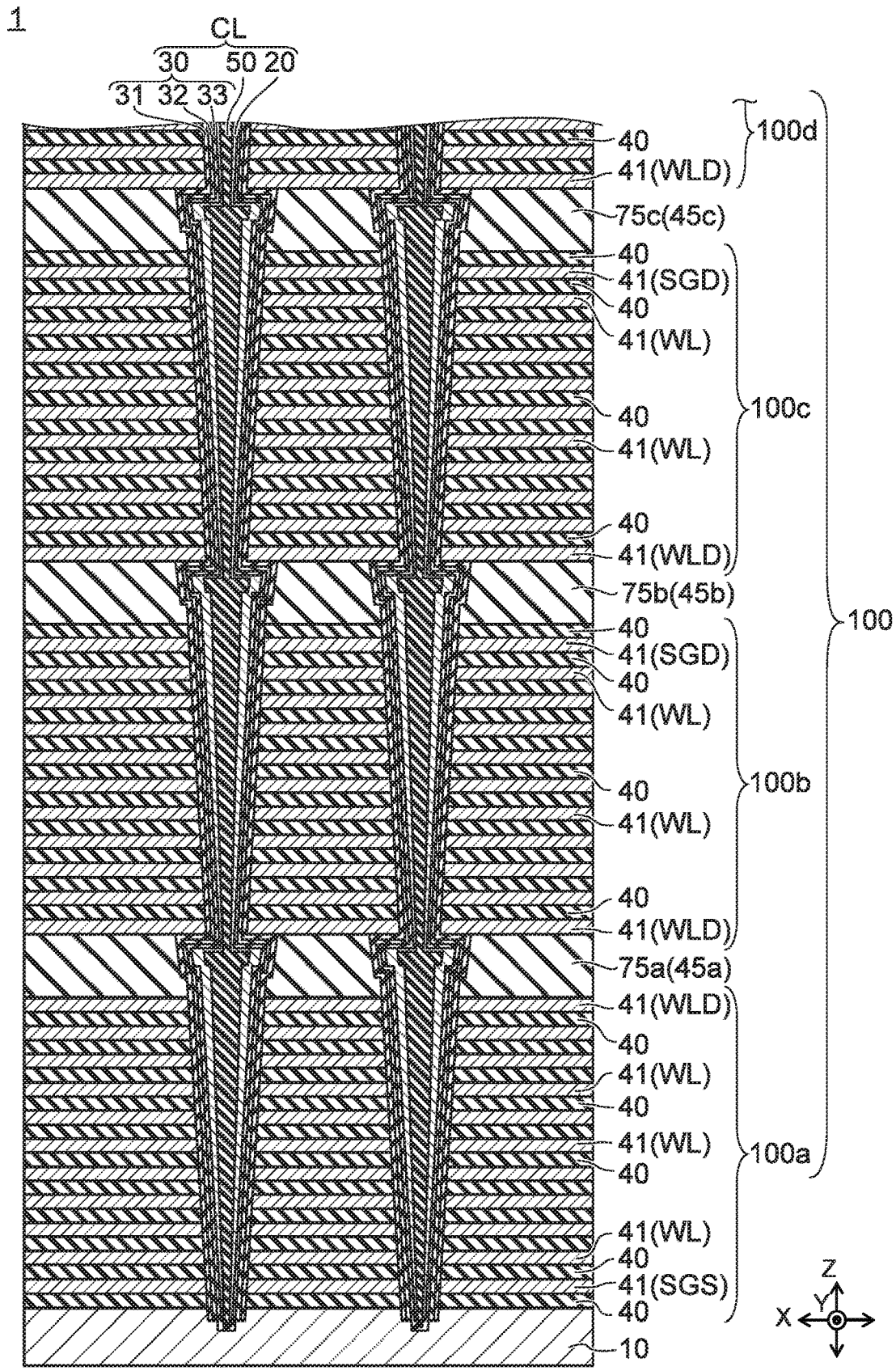
FIG. 9 is a schematic cross-sectional view of a semiconductor device of a second embodiment.

FIG. 9 is a schematic cross-sectional view of a semiconductor device of a second embodiment.

As shown in FIG. 9, in the semiconductor device of the second embodiment, three or more stacked portions (for example, a first stacked portion 100a, a second stacked portion 100b, a third stacked portion 100c, and a fourth stacked portion 100d) are provided. The stacked portions (for example, the first to fourth stacked portions 100a to 100d) are stacked on the substrate 10 in the Z-direction. Each of high dielectric layers (first to third high dielectric layers 75a to 75c) is provided as the connection portion 45 (for example, first to third connection portions 45a to 45c) between the stacked portions.

Also in the second embodiment, each of the high dielectric layers (first to third high dielectric layers 75a to 75c) is used as the connection portion (for example, the first to third connection portions 45a to 45c). For this reason, even in a case where the multiple connection portions are provided, it is possible to prevent a decrease in cell current. In addition, the high dielectric layer 75 is provided around the corner portion 20p. For this reason, it is possible to easily induce a channel in the semiconductor body 20.

Second Embodiment: Manufacturing Method

The semiconductor device of the second embodiment can be formed by repeating the formation of the stacked portion and the formation of the holes several times.

By performing the formation of the stacked body (stacked portion) and the formation of the holes several times, it becomes easy to form the holes. In addition, also in the second embodiment, each of the high dielectric layers 75 (first to third high dielectric layers 75a to 75c) is formed as the connection portion (for example, first to third connection portions 45a to 45c). Accordingly, a decrease in cell current can also be prevented.

Third Embodiment: Semiconductor Device

Figure 10:
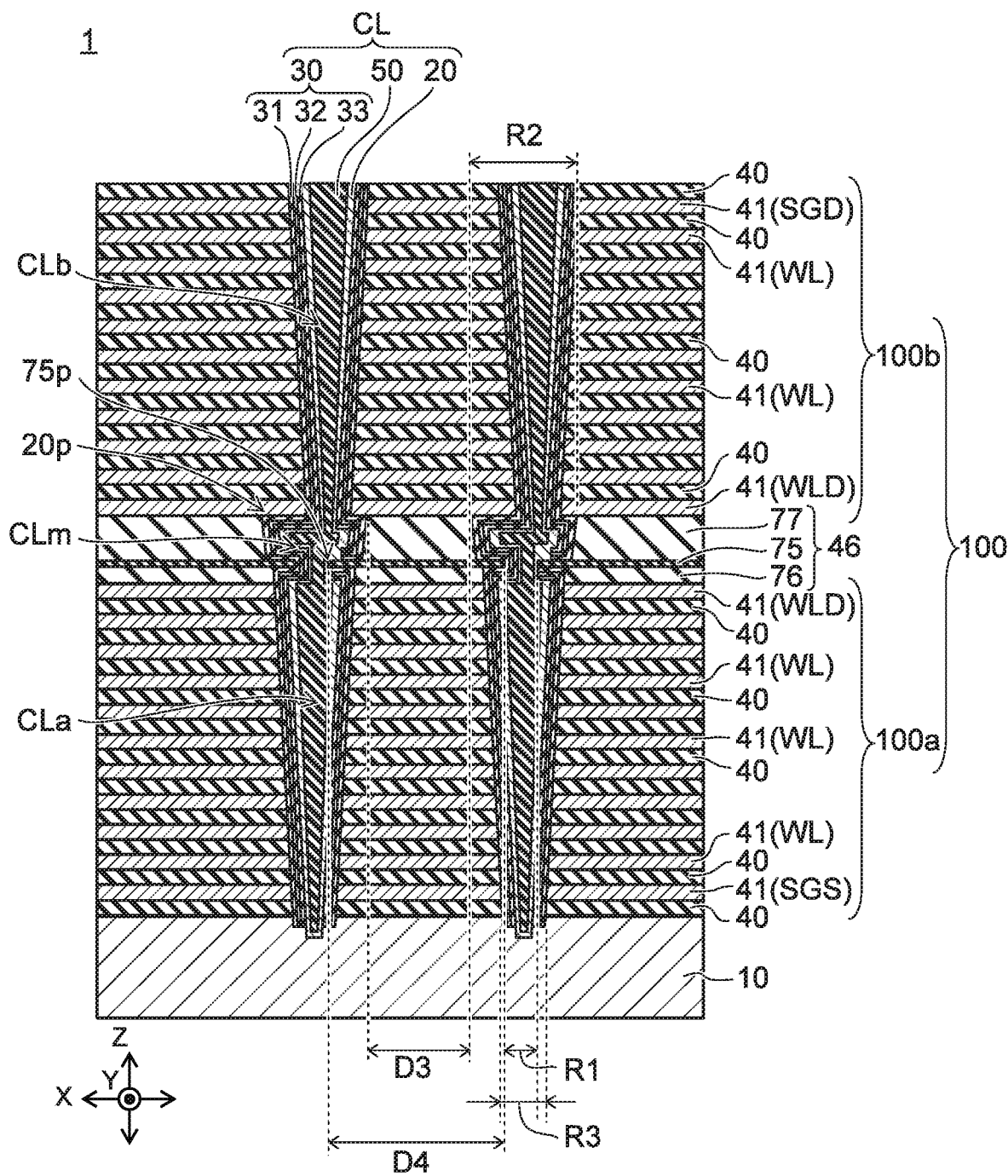
FIG. 10 is a schematic cross-sectional view of a semiconductor device according to a third embodiment.

FIG. 10 is a schematic cross-sectional view of a semiconductor device according to a third embodiment.

As shown in FIG. 10, the semiconductor device of the third embodiment is different from the semiconductor device of the first embodiment in that a connection portion 46 includes insulating layers 76 and 77, and the high dielectric layer 75 has a protrusion portion 75p. The insulating layer 76 is provided between the first stacked portion 100a and the second stacked portion 100b. The insulating layer 77 is provided between the insulating layer 76 and the second stacked portion 100b. The high dielectric layer 75 is provided between the insulating layer 76 and the insulating layer 77.

The protrusion portion 75p is substantially circular. The protrusion portion 75p surrounds a portion of the intermediate portion CLm. For example, a portion of the protrusion portion 75p is in contact with the semiconductor body 20. When viewed from the Z-direction, the maximum diameter R1 of the intermediate portion CLm surrounded by the protrusion portion 75p is smaller than the maximum diameter R2 of the intermediate portion CLm surrounded by the insulating layer 77. When viewed from the Z-direction, the maximum diameter R1 of the intermediate portion CLm surrounded by the protrusion portion 75p is smaller than the diameter R3 of the lower end of the first portion CLa. At this time, in the adjacent two column-shaped portions CL, the shortest distance D3 of the intermediate portion CLm surrounded by the high dielectric layer 75 is longer than the distance D4 of the upper end of the first portion CLa. When viewed from the Z-direction, the protrusion portion 75p overlaps the memory film 30 in the first stacked portion 100a.

Also in the third embodiment, the connection portion 46 includes a high dielectric layer 75. Accordingly, it is possible to prevent a decrease in cell current. In addition, the high dielectric layer 75 is provided around the corner portion 20p. For this reason, it is possible to easily induce a channel in the semiconductor body 20.

Third Embodiment: Manufacturing Method

An example of a method of manufacturing a semiconductor device according to a third embodiment will be described.

FIGS. 11A to 14 are schematic cross-sectional views showing the semiconductor device according to the third embodiment.

<Formation of First Stacked Portion 100Af to First Hole MHa>

Figure 11A:
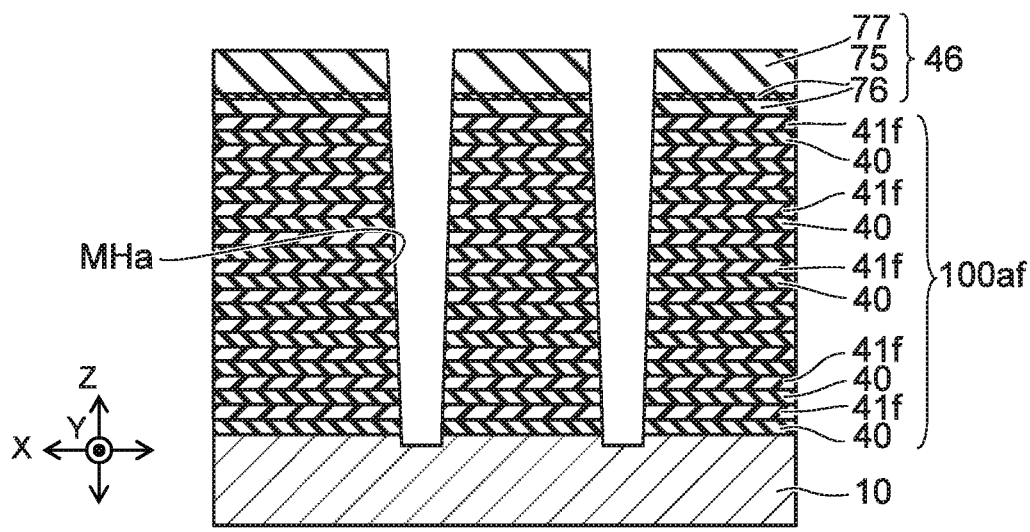
FIGS. 11A to 14 are schematic cross-sectional views showing the semiconductor device according to the third embodiment.

For example, according to the manufacturing method described with reference to FIG. 5A, the processes up to the process of forming the first hole MHa are performed (steps S110 to S130) to obtain the structure shown in FIG. 11A. At this time, the connection portion 46 is formed through the process of forming the insulating layer 76 on the first stacked portion 100af, the process of forming the high dielectric layer 75, and the process of forming the insulating layer 77 on the high dielectric layer 75. The same material as the insulator 40 is selected for the insulating layer 76 and the insulating layer 77. For example, a silicon oxide is selected for the insulating layer 76 and the insulating layer 77.

<Formation of Sacrificial Film 61>

Figure 11B:
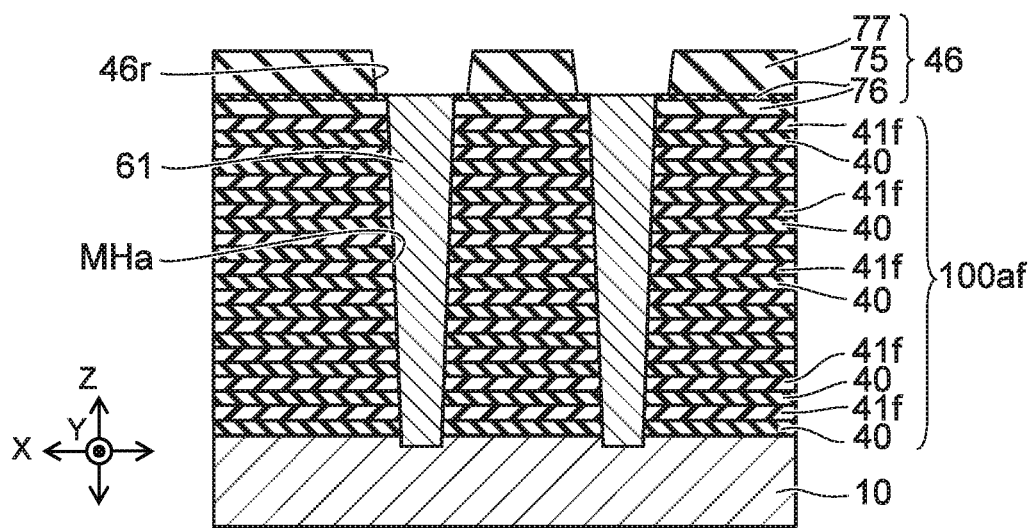

For example, according to the manufacturing method described with reference to FIG. 5B and FIG. 6A, the processes up to the process of forming the first sacrificial film 61 are performed (step S140) to obtain the structure shown in FIG. 11B. The recessed portion 46r is formed by recessing the insulating layer 77.

<Formation of Second Stacked Portion 100Bf to Removal of Sacrificial Film 61>

For example, according to the manufacturing method described with reference to FIG. 6B and FIG. 7A, the processes up to the process of removing the first sacrificial film 61 and forming the hole MH are performed (steps S150 to S190). After that, the side surface of the replacement member 41f exposed to the hole MH, the side surface of the insulator 40, and the side surface of the insulating layer 76 are recessed to obtain the structure shown in FIG. 12A.

Figure 12A:
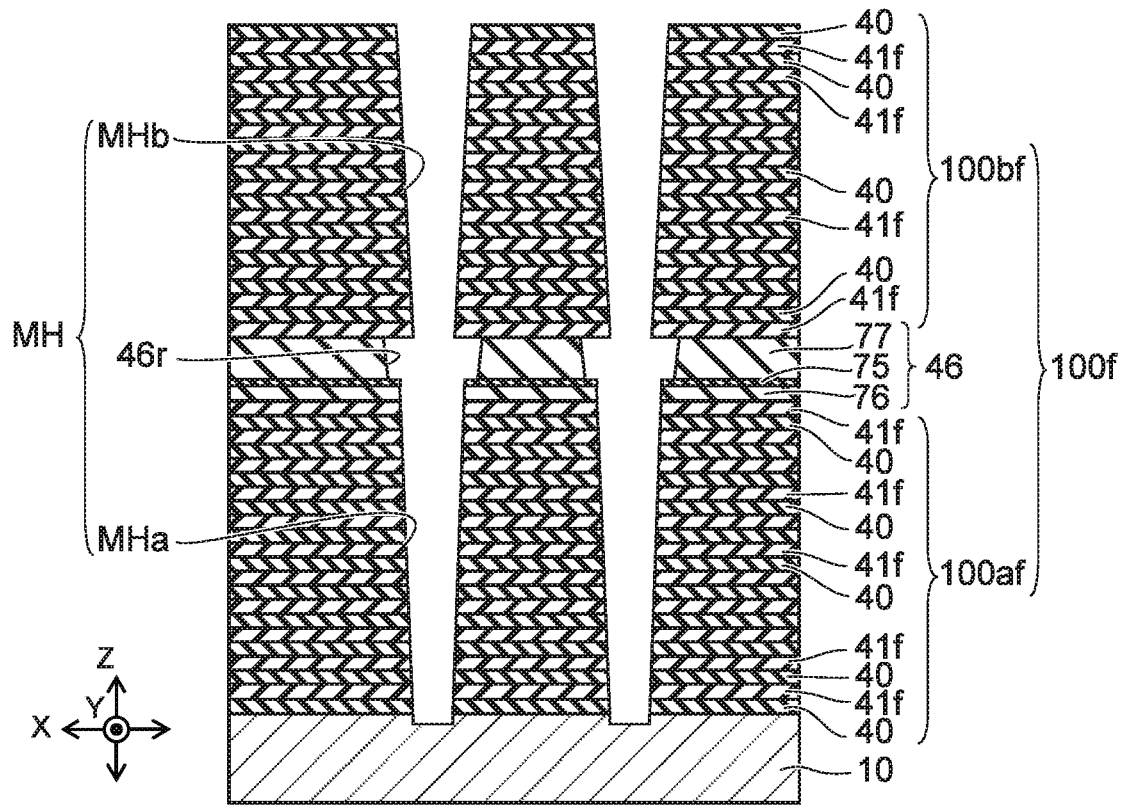
Figure 12B:
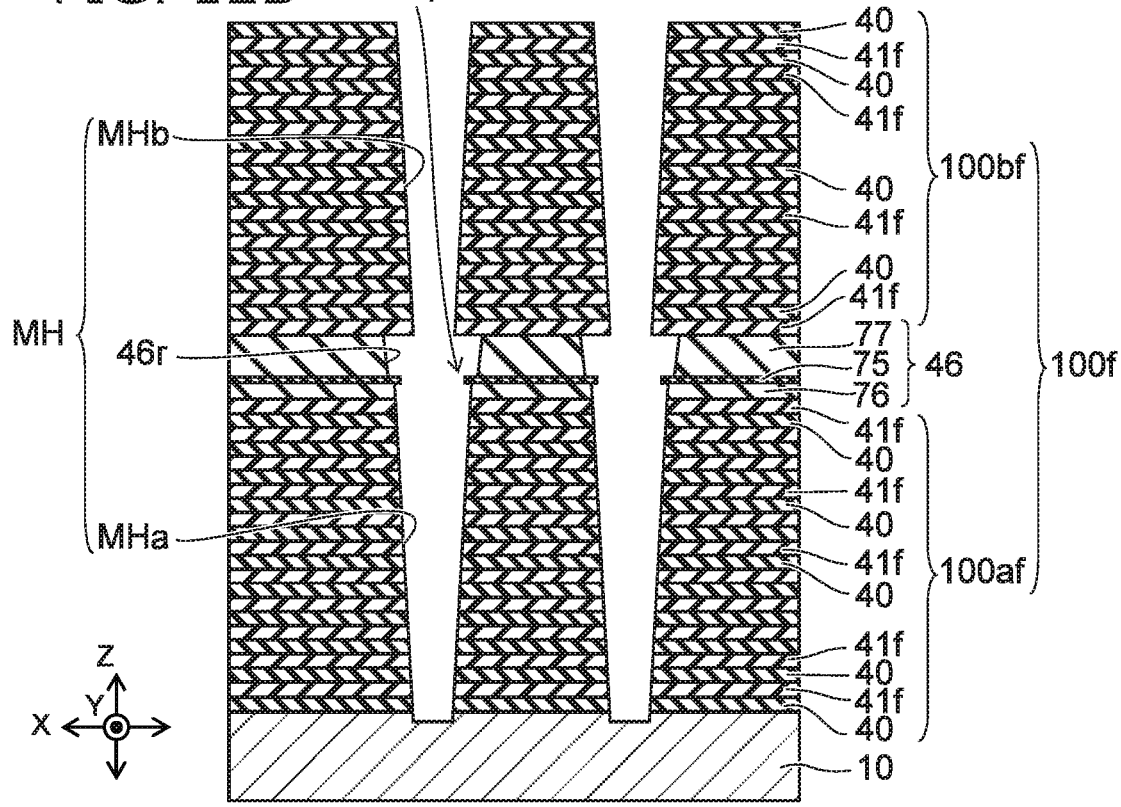

As shown in FIG. 12B, the exposed surfaces of the first stacked portion 100af, the second stacked portion 100bf, the insulating layer 76, and the insulating layer 77 in the hole MH are recessed. For example, etching is performed on the side surface of the hole MH. Accordingly, the exposed surfaces of the first stacked portion 100af, the second stacked portion 100bf, the insulating layer 76, and the insulating layer 77 in the hole MH are recessed. Accordingly, the protrusion portion 75p protruding into the hole MH is formed in the high dielectric layer 75. The etching at this time may be performed several times, for example, by changing the etchant.

In a case where the replacement member 41f is a silicon nitride and the insulator 40, the insulating layer 76, and the insulating layer 77 are a silicon oxide, an oxidizing agent may be supplied into the hole MH. Accordingly, the exposed surface of the replacement member 41f in the hole MH is oxidized. After that, by performing etching, the exposed surfaces of the first stacked portion 100af, the second stacked portion 100bf, the insulating layer 76, and the insulating layer 77 may be recessed. Accordingly, it is possible to prevent the formation of unevenness in the hole MH while collectively processing the hole MH.

<Formation of Column-Shaped Portion CL>

Figure 13A:
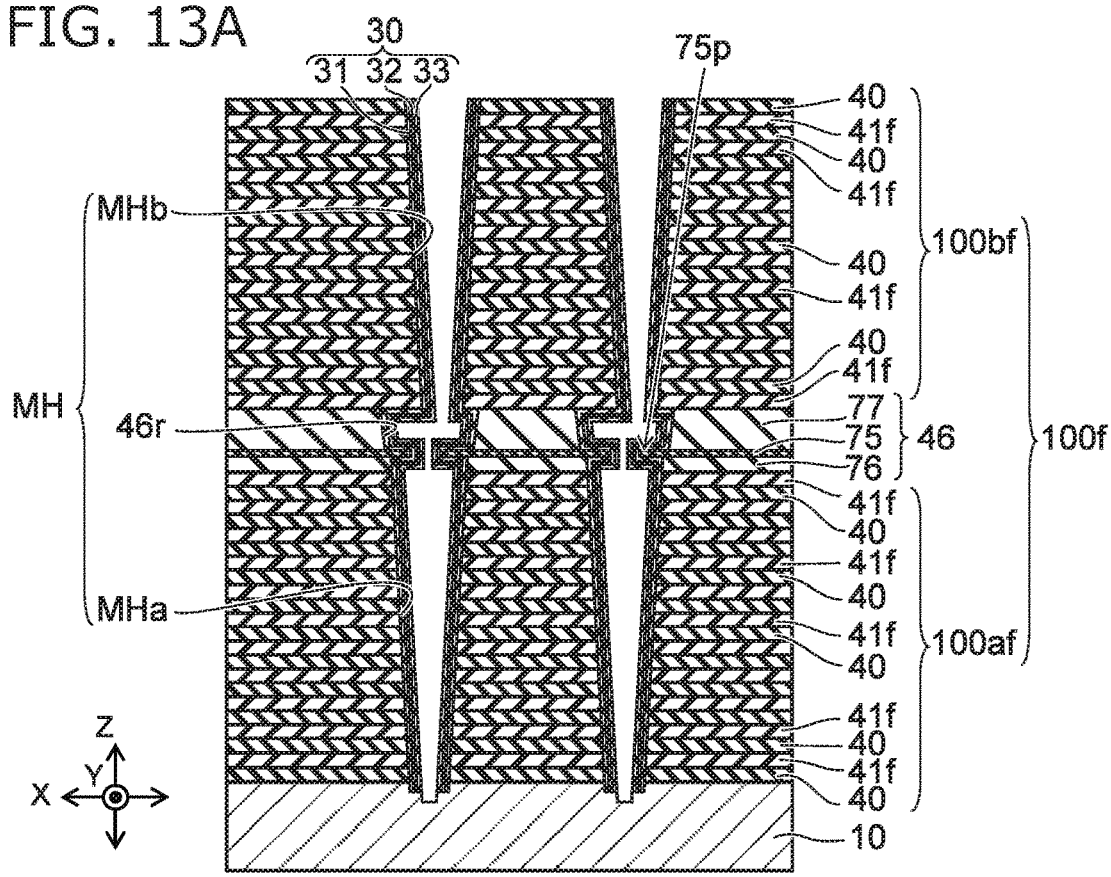

As shown in FIG. 13A, the memory film 30 is formed on the inner wall of the hole MH. For example, the block insulating film 31 is formed on the inner wall of the hole MH. The charge storage portion 32 is formed on the block insulating film 31. The tunnel insulating film 33 is formed on the charge storage portion 32. Accordingly, the memory film 30 is formed.

Figure 13B:
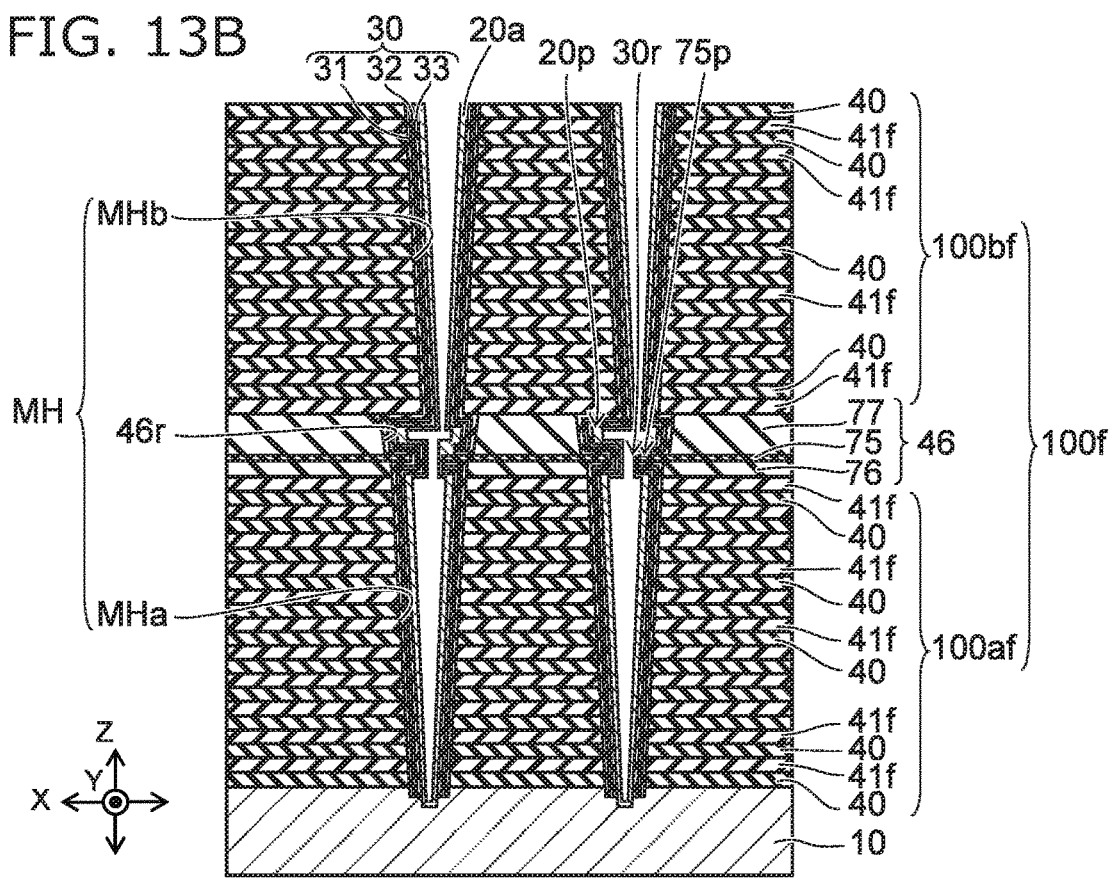

As shown in FIG. 13B, a first semiconductor film 20a is formed on the memory film 30. After that, the memory film 30 and the first semiconductor film 20a formed on the bottom of the hole MH are removed by anisotropic etching such as RIE. At this time, the memory film 30 and the first semiconductor film 20a in the side wall of the hole MH are allowed to remain. Accordingly, the upper surface of the substrate 10 is exposed to the bottom of the hole MH. Herein, in some cases, the central axis of the first hole MHa and the central axis of the second hole MHb may deviate from each other. In this case, a portion of the memory film 30 formed in the side wall of the hole MH is also removed. Accordingly, a recessed portion 30r in which a portion of the memory film 30 is removed in the side wall of the hole MH is formed. The recessed portion 30r is formed in a portion of the side wall of the protrusion portion 75p. For example, by forming the recessed portion 30r, a portion of the protrusion portion 75p is exposed to the hole MH.

Figure 14:
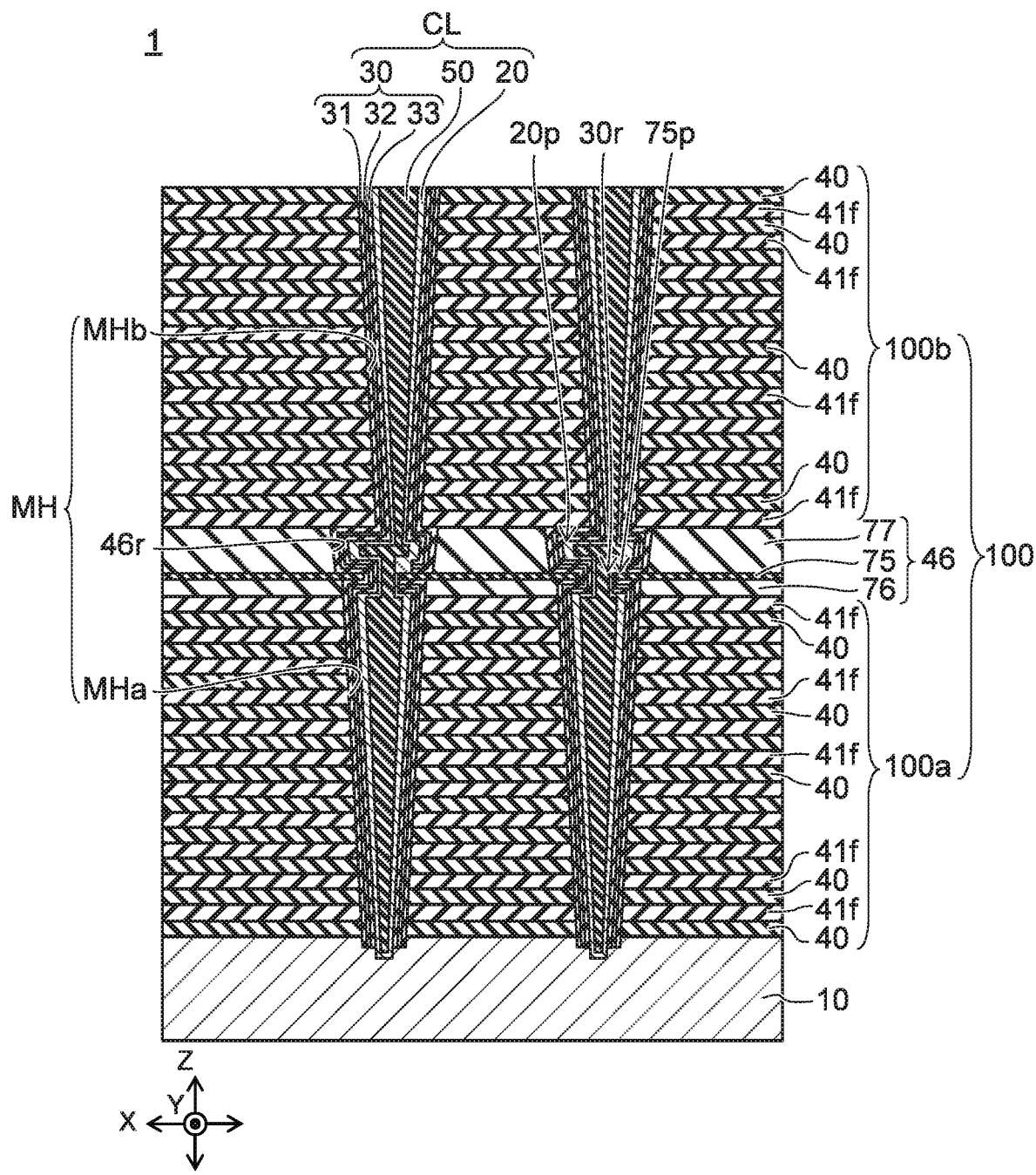

As shown in FIG. 14, a second semiconductor film 20b is formed on the memory film 30 and in the recessed portion 30r. The semiconductor body 20 is formed of the first semiconductor film 20a and the second semiconductor film 20b.

A core layer 50 is formed on the semiconductor body 20. Accordingly, the column-shaped portion CL is formed (step S200).

<Formation of Electrode Layer 70 to Formation of Bit Line BL and the Like>

For example, according to the manufacturing method described with reference to FIG. 2 and FIG. 1, the processes up to the process of forming the bit line BL and the like are performed (step S210), and thus, the semiconductor device of the third embodiment is formed.

The configuration in which the high dielectric layer 75 having the protrusion portion 75p is not provided is considered. In this case, the memory film 30 formed on the side wall of the first hole MHa may be removed simultaneously together with the memory film 30 formed on the bottom of the hole MH. Accordingly, there is a circumstance that the semiconductor body 20 may be short-circuited with the electrode layer 70 when forming the semiconductor body 20.

On the other hand, in the third embodiment, the high dielectric layer 75 has the protrusion portion 75p. At this time, the protrusion portion 75p is formed on the memory film 30 formed on the side wall of the first hole MHa. For this reason, when viewed from the Z-direction, the memory film 30 formed on the side wall of the first hole MHa overlaps the protrusion portion 75p. When removing the memory film 30 on the bottom of the hole MH, the protrusion portion 75p plays a role of eaves. Accordingly, the removal of the memory film 30 formed on the side wall of the first hole MHa is prevented. Accordingly, it is possible to prevent occurrence of a short circuit between the semiconductor body 20 and the electrode layer 70.

In addition, in the third embodiment, the insulating layer 76 is provided between the high dielectric layer 75 and the second stacked portion 100b. Accordingly, it is possible to reduce the possibility of removing the memory film 30 in the first stacked portion 100a when the connecting portion (the recessed portion 30r in FIG. 13A) between the semiconductor body 20 and the semiconductor pillar 11 is formed.

Fourth Embodiment: Semiconductor Device

Figure 15:
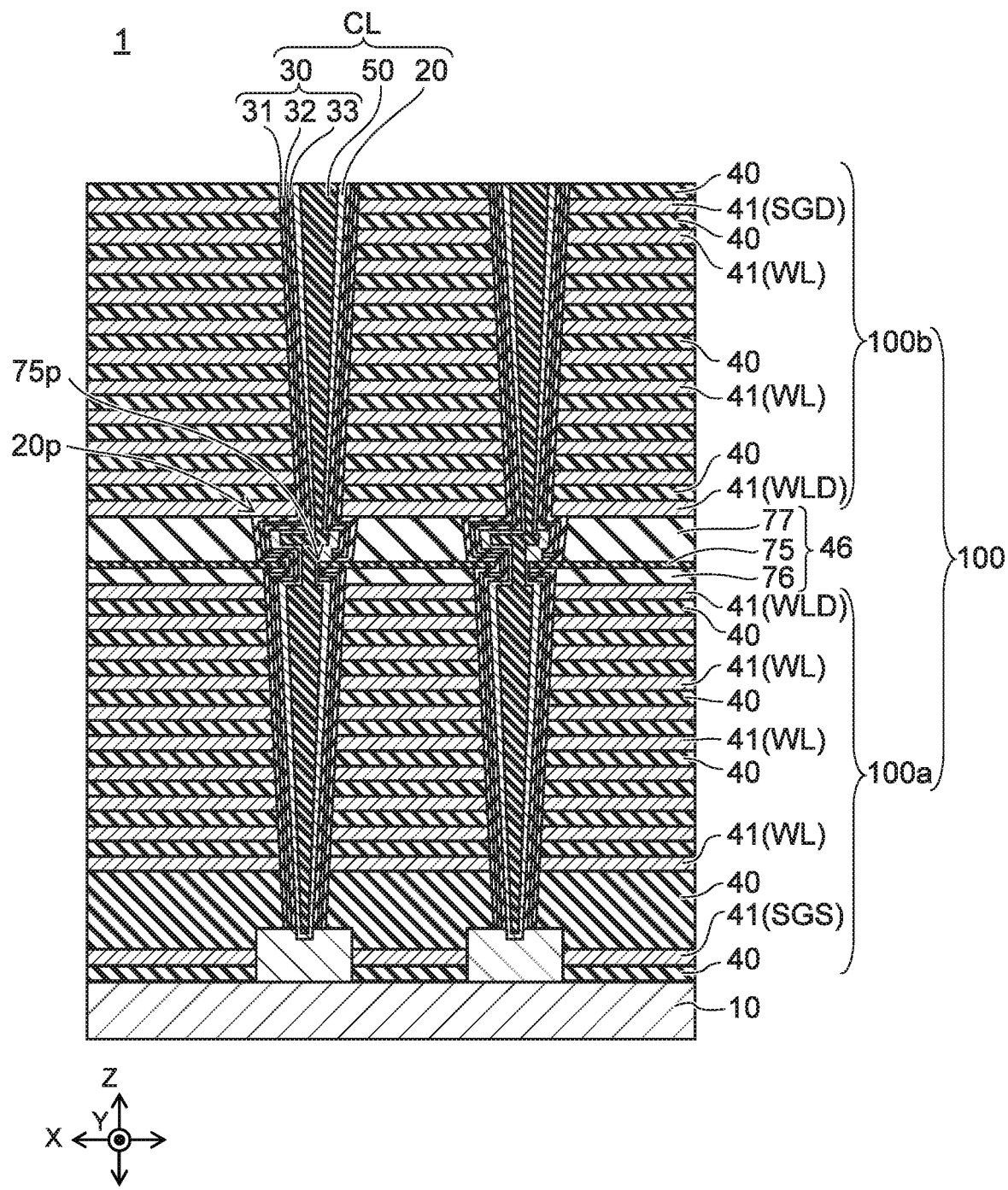
FIG. 15 is a schematic cross-sectional view of a semiconductor device of a fourth embodiment.

FIG. 15 is a schematic cross-sectional view of a semiconductor device of a fourth embodiment.

As shown in FIG. 15, the semiconductor device of the fourth embodiment is different from the semiconductor devices of the above embodiments in that a semiconductor pillar 11 is provided between the substrate 10 and the column-shaped portion CL.

<Semiconductor Pillar 11>

The semiconductor pillar 11 is provided in the stacked body 100. The semiconductor pillar 11 is in contact with the substrate 10 and the semiconductor body 20. The semiconductor pillar 11 is surrounded by at least one of the electrode layers 41. The semiconductor pillar 11 is formed, for example, from the upper surface of the substrate 10 by an epitaxial growth method.

In the fourth embodiment, the connection portion 46 also includes the high dielectric layer 75. Accordingly, it is possible to prevent a decrease in cell current. In addition, the high dielectric layer 75 is provided around the corner portion 20p. For this reason, it is possible to easily induce a channel in the semiconductor body 20.

As described above, according to each of the embodiments described above, a semiconductor device capable of preventing a decrease in cell current is provided.

Heretofore, several embodiments of the invention have been described, but these embodiments are presented as examples and are not intended to limit the scope of the invention. These novel embodiments can be implemented in various other forms, and various omissions, substitutions, and changes can be made without departing from the spirit of the invention. These embodiments and modifications are included in the scope and spirit of the invention and are included in the scope of the invention disclosed in the claims and equivalents thereof.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A semiconductor device comprising:
   a stacked body including:
      a first stacked portion including a plurality of electrode layers stacked in a first direction via an insulator;
      a second stacked portion including a plurality of electrode layers stacked in the first direction via an insulator and being disposed separately from the first stacked portion in the first direction; and
      a connection portion including a high dielectric layer provided between the first stacked portion and the second stacked portion, and having a dielectric constant higher than a dielectric constant of the insulator; and
   a column-shaped portion including:
      a first portion provided in the first stacked portion and extending in the first direction;
      a second portion provided in the second stacked portion and extending in the first direction; and
      an intermediate portion provided in the connection portion and connected the first portion to the second portion,
   the connection portion includes an insulating layer between the high dielectric layer and the second stacked portion, and
   a maximum diameter of a portion, which is surrounded by the high dielectric layer, of the intermediate portion is smaller than a diameter of a lower end of the first portion when viewed from the first direction.

2. The device according to claim 1, wherein the high dielectric layer is provided in the entire connection portion.

3. The device according to claim 1, wherein the column-shaped portion includes:
   a semiconductor body extending in the first direction; and
   a charge storage portion provided between the semiconductor body and the first stacked portion, and between the semiconductor body and the second stacked portion.

4. The device according to claim 3, wherein the semiconductor body has a corner portion surrounded by the connection portion.

5. A semiconductor device comprising:
   a stacked body including:
      a first stacked portion including a plurality of electrode layers stacked in a first direction via an insulator;
      a second stacked portion including a plurality of electrode layers stacked in the first direction via an insulator and being disposed separately from the first stacked portion in the first direction; and
      a connection portion including a high dielectric layer provided between the first stacked portion and the second stacked portion, and having a dielectric constant higher than a dielectric constant of the insulator; and
   a column-shaped portion including:

a first portion provided in the first stacked portion and extending in the first direction;
a second portion provided in the second stacked portion and extending in the first direction; and
an intermediate portion provided in the connection portion and connected the first portion to the second portion,
a maximum diameter of the intermediate portion being larger than a diameter of a lower end of the second portion when viewed from the first direction.

6. A semiconductor device comprising:
a stacked body including:
a first stacked portion including a plurality of electrode layers stacked in a first direction via an insulator;
a second stacked portion including a plurality of electrode layers stacked in the first direction via an insulator and being disposed separately from the first stacked portion in the first direction; and
a connection portion including a high dielectric layer provided between the first stacked portion and the second stacked portion, and having a dielectric constant higher than a dielectric constant of the insulator; and
a column-shaped portion including:
a first portion provided in the first stacked portion and extending in the first direction;
a second portion provided in the second stacked portion and extending in the first direction; and
an intermediate portion provided in the connection portion and connected the first portion to the second portion,
the high dielectric layer including at least one selected from the group consisting of a hafnium oxide, an aluminum oxide, a silicon carbonitride, and a zirconium oxide.

7. A semiconductor device comprising:
a stacked body including:
a first stacked portion including a plurality of electrode layers stacked in a first direction via an insulator;
a second stacked portion including a plurality of electrode layers stacked in the first direction via an insulator and being disposed separately from the first stacked portion in the first direction; and
a connection portion including a high dielectric layer provided between the first stacked portion and the second stacked portion, and having a dielectric constant higher than a dielectric constant of the insulator; and
a column-shaped portion including:
a first portion provided in the first stacked portion and extending in the first direction;
a second portion provided in the second stacked portion and extending in the first direction; and
an intermediate portion provided in the connection portion and connected the first portion to the second portion,
a thickness of the high dielectric layer being greater than a thickness of the insulator in the first direction.

8. A semiconductor device comprising:
a stacked body including:
a first electrode layer;
a connection portion provided on the first electrode layer via a first insulator, the connection portion including a high dielectric layer having a dielectric constant higher than a dielectric constant of the first insulator; and
a second electrode layer provided on the connection portion via a second insulator; and
first and second column-shaped portions provided adjacent to each other in the stacked body, and extending in a first direction of the stacked body,
a shortest distance between the first and second column-shaped portions in a portion surrounded by the connection portion being shorter than a shortest distance between the first and second column-shaped portions in a portion surrounded by the second insulator.

9. The device according to claim 8, wherein the high dielectric layer is provided in the entire connection portion.

10. The device according to claim 8, wherein
the connection portion includes an insulating layer between the high dielectric layer and the second insulator, and
a shortest distance between the first and second column-shaped portions in a portion surrounded by the high dielectric layer is longer than a shortest distance between the first and second column-shaped portions in a portion surrounded by the first insulator.

11. The device according to claim 8, wherein the high dielectric layer includes a hafnium oxide.

12. The device according to claim 8, wherein a thickness of the high dielectric layer is greater than a thickness of the first insulator and a thickness of the second insulator.

13. The device according to claim 8, further comprising:
a semiconductor body provided in the column-shaped portion and extending in the first direction; and
a charge storage portion provided between the semiconductor body and the first electrode layer, and between the semiconductor body and the second electrode layer.

14. The device according to claim 13, wherein the semiconductor body has a corner portion surrounded by the connection portion.

15. A method of manufacturing a semiconductor device, comprising:
forming a first stacked portion including a plurality of replacement members stacked via an insulator;
forming a connection portion on the first stacked portion, the connection portion including a high dielectric layer having a dielectric constant higher than a dielectric constant of the insulator
forming a first hole penetrating the connection portion and the first stacked portion;
forming a sacrificial film in the first hole;
forming a second stacked portion on the connection portion and on the sacrificial film, the second stacked portion including a plurality of replacement members stacked via the insulator;
forming a second hole penetrating the second stacked portion and reaching the sacrificial film;
removing the sacrificial film through the second hole; and
forming a column-shaped portion on a side wall of the first hole and a side wall of the second hole.

16. The method according to claim 15, wherein the forming of the sacrificial film includes:
forming a first sacrificial film in the first hole from an interior of the first stacked portion to a portion of an interior of the connection portion,
forming a recessed portion by recessing a side surface of the connection portion exposed to the first hole; and
forming a second sacrificial film on the recessed portion.

17. The method according to claim 15, further comprising recessing side surfaces of the plurality of replacement members through the first hole and the second hole after the removing of the sacrificial film.

18. The method according to claim 17, wherein the recessing of the side surfaces of the plurality of replacement members includes:
- supplying an oxidizing agent into the first hole and the second hole; and
- introducing an etchant into the first hole and the second hole.

19. The method according to claim 15, wherein the forming of the connection portion includes forming the high dielectric layer with a thickness greater than a thickness of the insulator.

* * * * *